(12) United States Patent
Takizawa (10) Patent No.: US 7,355,875 B2
(45) Date of Patent: Apr. 8, 2008

(54) NONVOLATILE SEMICONDUCTOR MEMORY DEVICE HAVING CAPACITOR ARRANGED BETWEEN POWER SUPPLIES TO PREVENT VOLTAGE FLUCTUATION

(75) Inventor: Makoto Takizawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 137 days.

(21) Appl. No.: 11/153,541

(22) Filed: Jun. 16, 2005

(65) Prior Publication Data
US 2005/0281117 A1 Dec. 22, 2005

(30) Foreign Application Priority Data
Jun. 21, 2004 (JP) .............................. 2004-182011

(51) Int. Cl.
*G11C 5/06* (2006.01)
(52) U.S. Cl. ........................... 365/63; 365/51; 365/226
(58) Field of Classification Search ............. 365/51 X, 365/63 O, 189.09, 210, 214, 226 X, 51, 63, 365/226
See application file for complete search history.

(56) References Cited

U.S. PATENT DOCUMENTS

| | | | |
|---|---|---|---|
| 6,335,898 B2 * | 1/2002 | Watanabe et al. ...... | 365/230.03 |
| 6,438,052 B1 * | 8/2002 | Sekine ....................... | 365/210 |
| 6,531,357 B2 | 3/2003 | Takeuchi et al. | |
| 6,982,893 B2 * | 1/2006 | Jakobs ....................... | 365/63 |
| 2002/0043700 A1 | 4/2002 | Sasaki et al. | |

OTHER PUBLICATIONS

U.S. Appl. No. 09/135,740, filed Aug. 18, 1998, Sasaki et al.

* cited by examiner

*Primary Examiner*—VanThu Nguyen
(74) *Attorney, Agent, or Firm*—Oblon, Spivak, McClelland, Maier & Neustadt, P.C.

(57) ABSTRACT

A nonvolatile semiconductor memory device comprises, an internal memory cell array formed in internal area of a surface of semiconductor substrate, a row decoder and a column decoder formed in the internal area to select memory cell of the internal memory cell array, a peripheral circuit formed in the internal area to write and read a selected memory cell in the memory cell array, and external memory cell array formed in external area of the surface of the semiconductor substrate arranged beside the internal memory cell array and electrically separated from the internal memory cell array.

10 Claims, 12 Drawing Sheets

NONVOLATILE SEMICONDUCTOR MEMORY DEVICE HAVING CAPACITOR ARRANGED BETWEEN POWER SUPPLIES TO PREVENT VOLTAGE FLUCTUATION

CROSS-REFERENCE TO RELATED APPLICATIONS

This application is based upon and claims the benefit of priority from prior Japanese Patent Application No. 2004-182011, filed Jun. 21, 2004, the entire contents of which are incorporated herein by reference.

BACKGROUND OF THE INVENTION

1. Field of the Invention

This invention relates to the semiconductor memory device which has the suitable structure for integration. Moreover, this invention relates to the manufacture method of a semiconductor memory device having the suitable structure for integration.

2. Description of the Related Art

An electrically erasable and programmable EEPROM, such as a NAND cell-type EEPROM that configures a NAND cell with a plurality of serially connected memory cells, has been known as one of semiconductor memory devices. A memory cell in the NAND cell-type EEPROM has a FETMOS structure with a charge storage layer (floating gate) and a control gate stacked on a semiconductor substrate. The memory cell stores data "0" or "1" depending on the amount of charge accumulated in the floating gate.

For market expansion of a semiconductor memory device, high integration of a semiconductor memory device and the reduction in cost are required. Therefore, it is necessary to make the pattern formed by optical lithography more detailed.

Reduced-projection-exposure equipment is used for the pattern formation of semiconductor equipment.

In order to make a pattern detailed, the large numerical aperture (NA) lens and the light source of short wavelength is used.

Furthermore, half-tone phase shift reticle is used increasingly.

The memory cell array of a semiconductor memory device has the pattern arranged periodically. Ultra-fine processing technology which was mentioned above is very effective technology to such a pattern. However, periodicity is deficient in the pattern of the end of a memory cell array.

Ultra-fine processing technology which was mentioned above is not much effective technology to the scarce pattern of periodicity.

In the case of a periodic scarce pattern, diffraction of light and the state of interference of light are differs from in the case of a periodic pattern.

Therefore, when exposure conditions are made suitable to the inside of a memory cell array, the exposure condition is not suitable for the pattern of the exterior of a memory cell array.

Therefore, the method which uses the memory cell structure located in the exterior of a memory cell array as the dummy memory cell which is not used electrically is disclosed in U.S. Patent No. 6531357.

The dummy memory cell which is not used electrically is not connected to the row decoder or the column decoder in the embodiment shown in this U.S. patent. However, common connection is made to the word line and bit line of a memory cell array. For this reason, when dummy memory cell receives a mechanical damage, the leak current of a memory cell array may increase.

The perimeter end of a dummy memory cell array is arranged inside from the perimeter end of a semiconductor chip by the above-mentioned reason.

Thereby, in case a chip is divided, mechanical damage does not reach the perimeter end of a dummy memory cell array from the perimeter end of a semiconductor chip. However, chip size increases.

This invention offers the semiconductor memory device having increased effective area in a chip, and its manufacture method, without increasing chip size.

SUMMARY OF THE INVENTION

A nonvolatile semiconductor memory device based on first aspect of the invention comprises, an internal memory cell array formed in internal area of a surface of semiconductor substrate;

a row decoder and a column decoder formed in the internal area to select memory cell of the internal memory cell array;

a peripheral circuit formed in the internal area to write and read a selected memory cell in the memory cell array; and external memory cell array formed in external area of the surface of the semiconductor substrate arranged beside the internal memory cell array and electrically separated from the internal memory cell array.

A nonvolatile semiconductor memory device based on second aspect of the invention comprises, a memory cell array formed on one side of a rectangular shaped semiconductor substrate;

a row decoder and a column decoder to select a memory cell of the memory cell array;

a peripheral circuit to write and read the selected memory cell; and conductive pads arranged along with the opposite side of the rectangular shaped semiconductor substrate, wherein the peripheral circuit comprising a capacitor, the capacitor is connected to a bias terminal via a capacitor wiring.

A nonvolatile semiconductor memory device based on third aspect of the invention comprises, a memory cell array formed on one side of a rectangular shaped semiconductor substrate;

a row decoder and a column decoder to select a memory cell of the memory cell array;

a peripheral circuit to write and read the selected memory cell; and conductive pads arranged along with the opposite side of the rectangular shaped semiconductor substrate, wherein the peripheral circuit comprising a MIM capacitor.

DETAILED DESCRIPTION OF THE INVENTION

Hereafter, the embodiment of this invention is explained referring to drawings.

Figure 1:
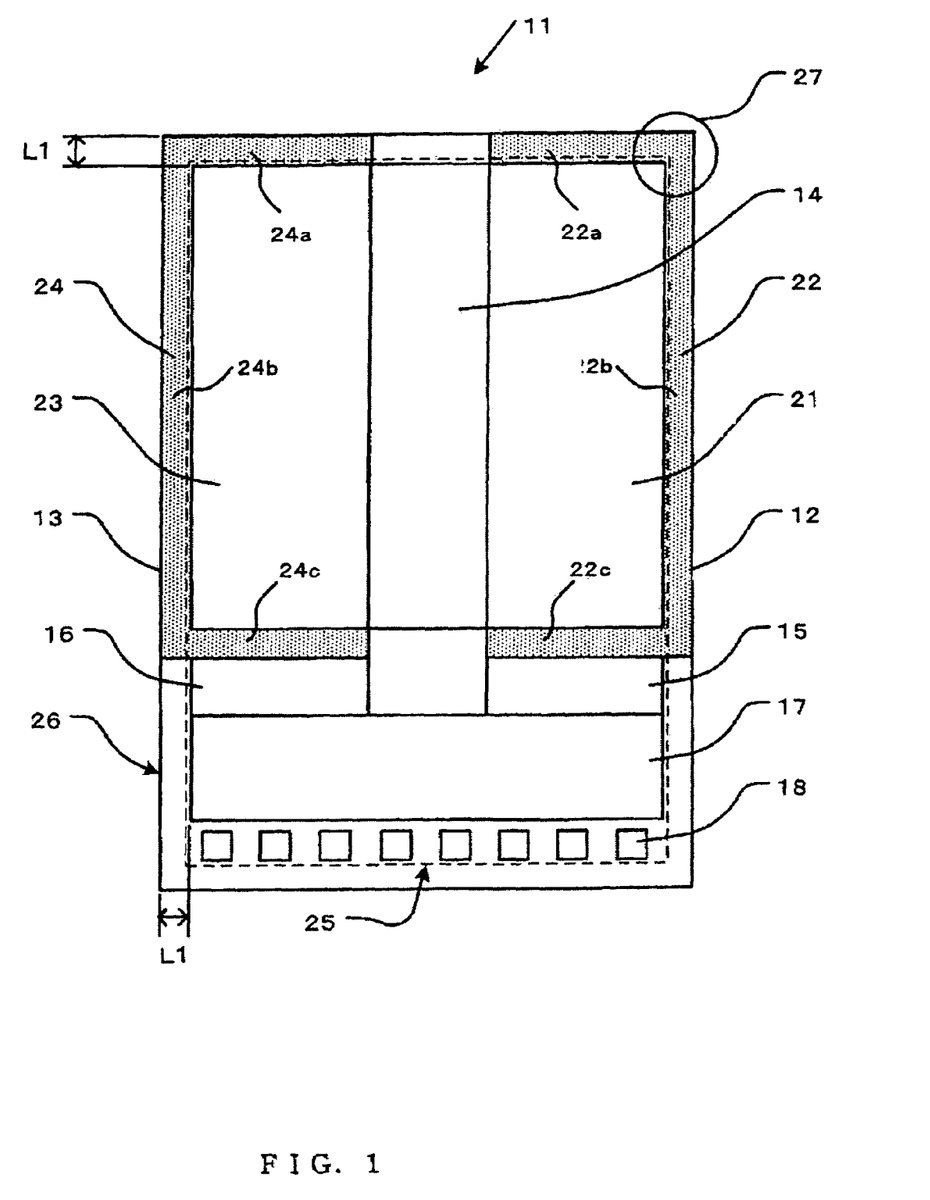
FIG. 1 is a figure showing the nonvolatile semiconductor memory concerning the first embodiment of this invention.
Figure 2:
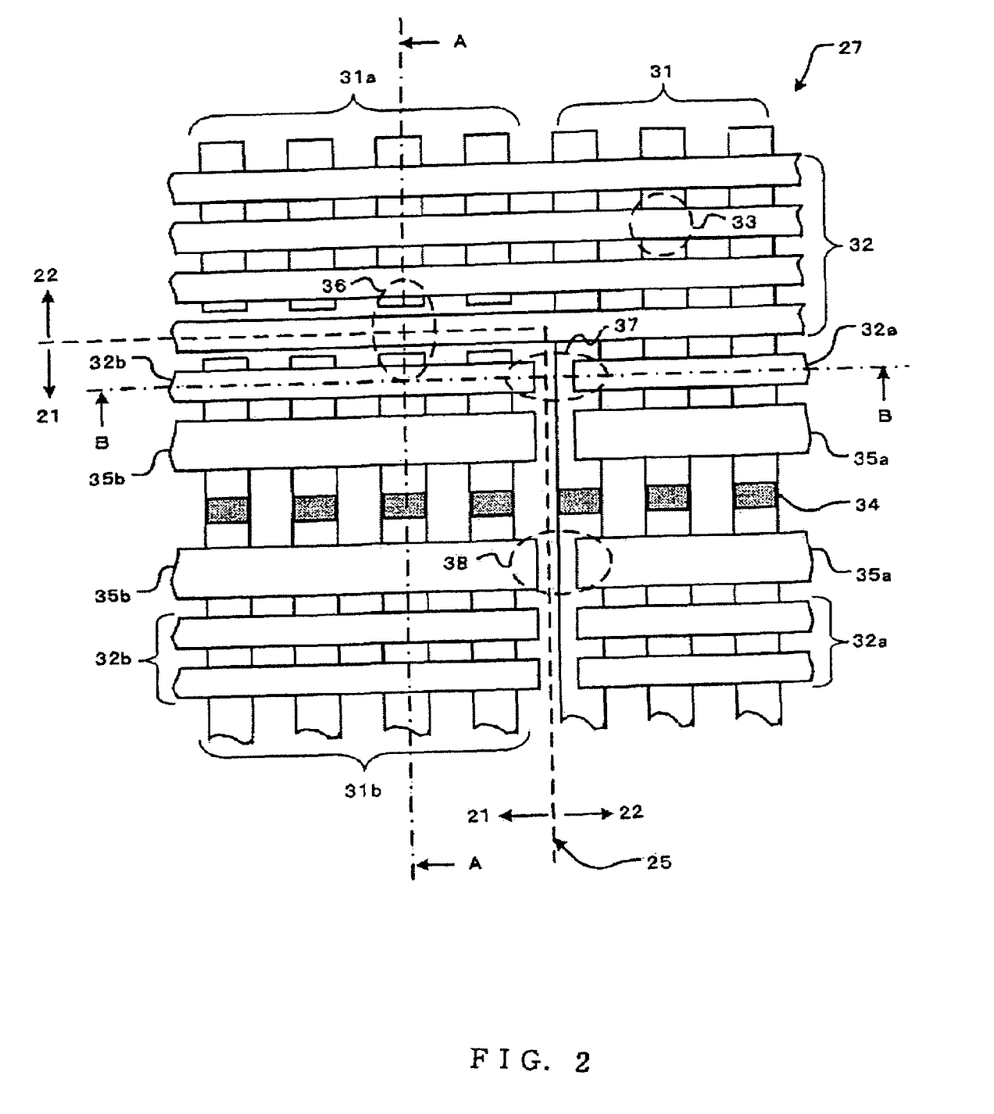
FIG. 2 is a plane view showing the memory cell array of the corner section concerning the first embodiment of this invention.
Figure 3A:
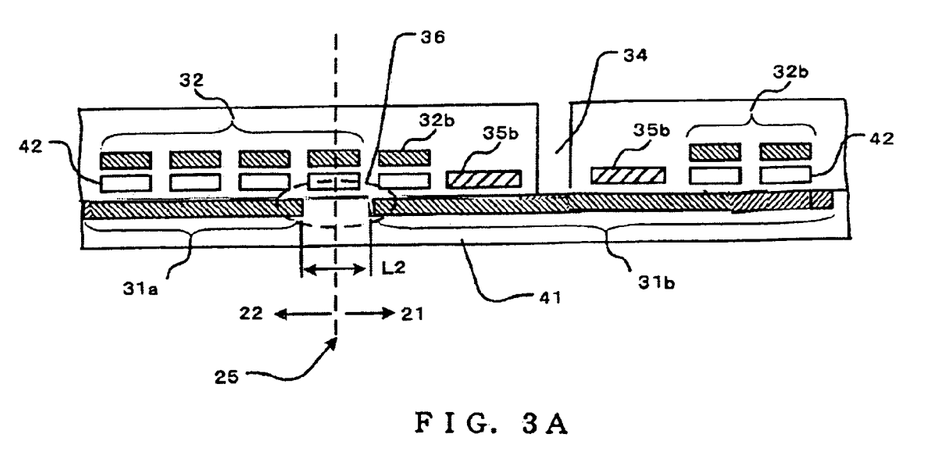
FIG. 3A is a sectional view at which cut along with the A-A line of FIG. 2, and looked from the direction of an arrow.
Figure 3B:
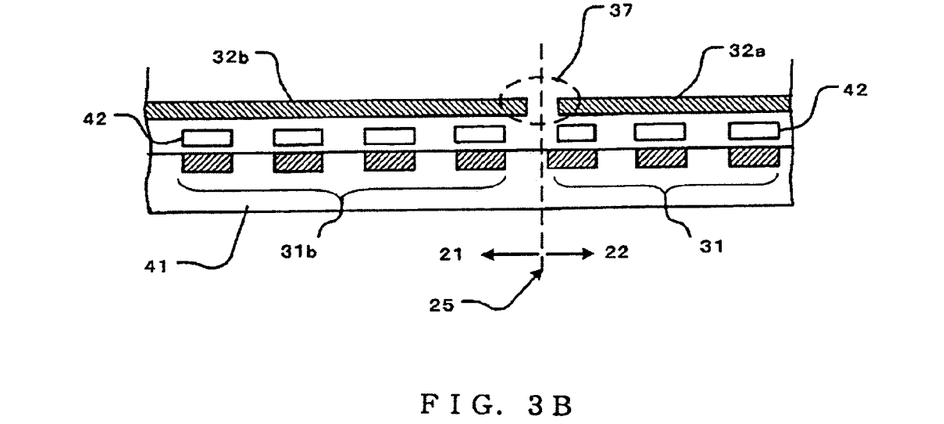
FIG. 3B is a sectional view at which cut along with the B-B line of FIG. 2, and looked from the direction of an arrow.

The semiconductor memory device regarding to the first embodiment of this invention is explained using FIG. 1 to FIG. 3. The first embodiment discloses a nonvolatile semiconductor memory device which has a floating gate.

FIG. 1 is a figure showing a nonvolatile semiconductor memory device of the first embodiment of the invention.

FIG. 2 is a plane view showing the principal part of a memory cell array of the first embodiment of the invention.

FIG. 3 is a sectional view showing the principal part of a memory cell array of the first embodiment of the invention.

FIG. 3A is a sectional view at which cut along with the A-A line of FIG. 2, and looked from the direction of an arrow.

FIG. 3B is a sectional view at which cut along with the B-B line of FIG. 2, and looked from the direction of an arrow.

The composition of the semiconductor memory device shown in FIG. 1 is as follows. The nonvolatile semiconductor memory device 11 of this embodiment has the memory cell arrays 12 and 13 arranged on the surface of semiconductor substrate. Moreover, it has the row decoder 14 and the column decoders 15 and 16 for write or read the memory cell array 12 and 13. Furthermore, it has the peripheral circuit 17 for writing or reading information in the memory cell array 12 and 13. And it has the connection pad 18 for making electric connection of the peripheral circuit 17 to an external circuit.

The memory cell array 12 has the internal memory cell array 21 and the external memory cell array 22. The external memory cell arrays 22a, 22b, and 22c are arranged so as to surround the outside of three sides of perimeters except the row decoder 14 side of the internal memory cell array 21.

Similarly, the memory cell array 13 has the internal memory cell array 23 and the external memory cell array 24. The external memory cell arrays 24a, 24b, and 24c are arranged so as to surround the outside of three sides of perimeters except the row decoder 14 side of the internal memory cell array 23.

The bit line or the word line of the external memory cell array 22 does not connect to the bit line or the word line of the internal memory cell array 21. Thereby, the external memory cell array 22 dissociates from the internal memory cell array 21 electrically.

Similarly, the bit line or the word line of the external memory cell array 24 does not connect to the bit line or the word line of the internal memory cell array 23. Thereby, the external memory cell array 24 dissociates from the internal memory cell array 23 electrically.

Furthermore, the external memory cell arrays 22a, 22b, 24a, and 24b are electrically arranged outside the active area 25. In the active area 25, the internal memory cell arrays 21 and 23, the row decoder 14, the column decoders 15 and 16, and the peripheral circuit 17 and the connection pad 18 are arranged.

The end portion of the external memory cell arrays 22a, 22b, 24a, and 24b is located approximately the same with the end portion of a chip 26.

The nonvolatile semiconductor memory device 11 mentioned above is created by carrying out dicing of the semiconductor wafer in which many nonvolatile semiconductor memory devices 11 were formed, and dividing it into a chip 26. In this case, the mechanical damages such as a micro crack, chipping, etc. may arise in the external memory cell arrays 22a, 22b, 24a, and 24b arranged at the end of a chip 26.

However, the active area 25 is electrically separated from the end of a chip 26 about 25 micrometer inside. This is equivalent to the distance L1 which the mechanical damage occur at the time of dicing does not attain to. Therefore, trouble does not arise in operation of the nonvolatile semiconductor memory device 11.

Thus, it is possible to arrange the external memory cell arrays 22a, 22b, 24a, and 24b near the end of a chip 26 and to use them as a dummy memory cell, without increasing chip size.

Next, the structure of the internal memory cell array 21 and the external memory cell array 22 is explained in detail referring to the corner part 27 of the memory cell array 12. As shown in FIG. 2, the bit line 31 and the word line 32 intersect perpendicularly. The memory cell of the corner part 27 is formed at the cross-sectional point 33. The bit line 31 is connected to the column decoder 15, and the word line 32 is connected to the row decoder 14, respectively.

The bit line contact hole 34 for connecting the bit line 31 to the sense amplifier, which is not illustrated, through the metal wiring, which is not illustrated, is formed on the part of the bit line 31. The selection line 35 for choosing the memory cell block is located on the both sides of the bit line contact hole 34, so as to be in parallel with the word line 32 and arranged at the predetermined intervals.

The bit line 31 is electrically divided into the external bit line 31a in the external memory cell array 22, and the internal bit line 31b in the internal memory cell array 21 by bit line dividing portion 36, bordering on the boundary line of active area (internal area) 25 and an external area.

Similarly, the word line 32 is divided into external word line 32a in the external memory cell array 22, and internal word line 32b in the internal memory cell 21 by word line dividing portion 37.

Furthermore, the selection line 35 is divided into external selection line 35a in the external memory cell array 22, and internal selection line 35b in the internal memory cell 21 by selection line dividing portion 38.

Next, as shown in FIG. 3, the bit lines 31a and 31b are in the upper part of p well area 41 of a semiconductor wafer. The gate insulation film, not illustrated, is formed above bit line 31a and 31b and a plurality of floating gates 42 are formed above the gate insulation film. The word lines 32a and 32b, which behave as a control gate, are formed above the insulated film, which is not illustrated, on the floating gate 42, respectively.

Sign 25 indicates the boundary of an electrically inactive external area and an active area. Bit line dividing area 36 is in this area of 25. In this portion, bit line 31a and bit line 31b is formed separating by distance L2.

The word line 32 is divided into external word line 32a in the external memory cell array 22 and internal word line 32b in the internal memory cell 21, by word line dividing area.

It is possible to separate the internal memory cell array 21 and 23 electrically from external memory cell arrays 22 and 24.

Figure 4:
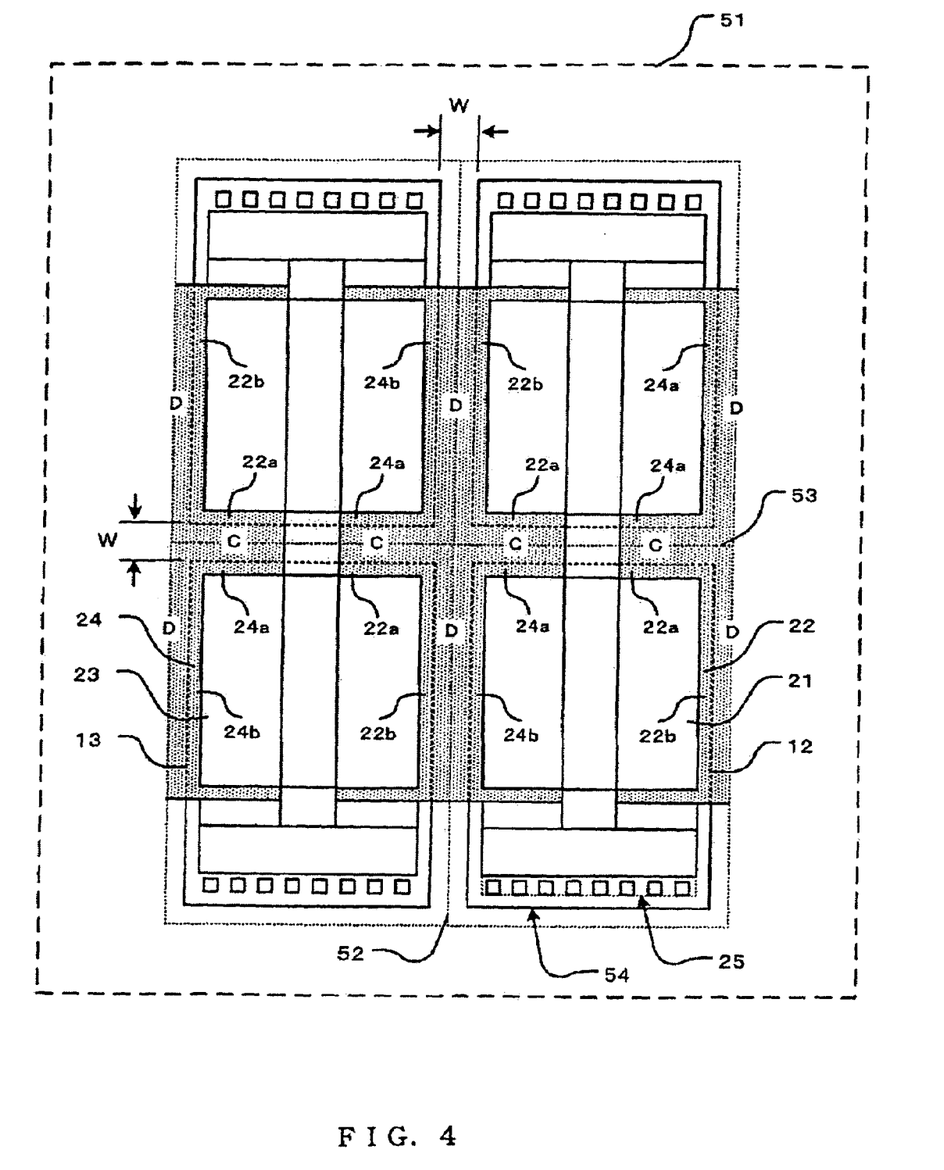
FIG. 4 is a figure showing the pattern on the reticle which imprints the memory cell array concerning the first embodiment of this invention on a semiconductor substrate.
Figure 5:
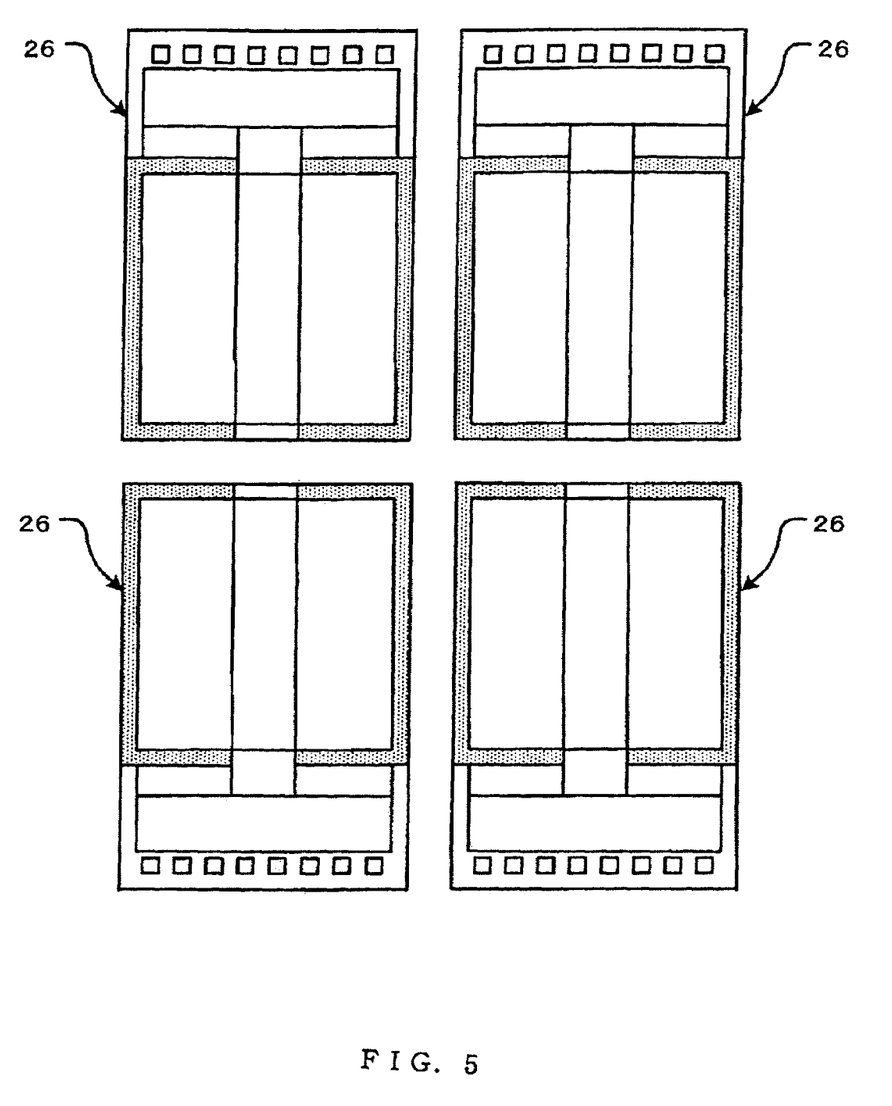
FIG. 5 is a figure showing the state where the nonvolatile semiconductor memory concerning the first embodiment of this invention was divided into the chip.

Next, the manufacture method of the nonvolatile semiconductor memory device 11 is explained. FIG. 4 shows the pattern on the reticle which transfers on a semiconductor wafer. And FIG. 5 shows the state of the nonvolatile semiconductor device 11 where it was divided into chips.

As shown in FIG. 4, the reticle 51 used at the exposure process for manufacturing the nonvolatile semiconductor memory device 11 has, for example, a silica glass substrate, the dicing line areas 52 and 53 of the shape of a grid, and a plurality of unit pattern 54 arranged in the rectangle-like grid surrounded by the dicing line areas, both arranged on the substrate principal plane. Hereafter, the reticle is explained referring to FIG. 1 and based on FIG. 4.

In the unit pattern 54, the internal memory cell arrays 21 and 23 are arranged at the one end portion of the internal area 25 of the rectangle-like grid surrounded by the dicing line patterns 52 and 53. In the internal area 25, the internal memory cell arrays 21 and 23, and the row decoder 14 and the column decoder 15, and 16 patterns are arranged. Peripheral circuit 17 for writing or reading memory information to/from the internal memory cell array 21 and 23, is arranged at the other end side of the internal area 25. In the periphery area of the internal area 25, the external memory cell array patterns 22 and 24, which are electrically separated from the internal memory cell arrays 21 and 23, are arranged.

In the rectangle-like grid of one direction, the unit pattern 54 is arranged so that direction of peripheral circuit 17 pattern may become opposite by turns, and the unit pattern 54 is arranged at the rectangle-like grid of one direction and the direction which intersects perpendicularly so that direction of peripheral circuit 17 pattern may become the same.

That is, external memory cell array 22a countered to external memory cell array 24a in an adjoining rectangle-like grid, spacing by the dicing width W. Moreover, external memory cell array 22b countered to external memory cell array 24b in an adjoining rectangle-like grid, spacing by the dicing width W.

In the dicing area where the external memory cell arrays 22a and 24a are facing, and in the dicing area where the external memory cell arrays 22b and 24b are facing, the memory cell arrays C and D, which continuously formed from the external memory cell arrays 22a, 22b, 24a, and 24b, are formed respectively.

Since it dissociates electrically with the internal memory cell arrays 21 and 23, the memory cell arrays C and D formed in the dicing area are dummy memory cells.

Next, the pattern of a reticle 51 was transferred on the semiconductor wafer with reduced-projection-exposure equipment, and the nonvolatile semiconductor memory device 11 was formed according to the well-known process.

Finally, as shown in FIG. 5, the chip 26 was obtained by cutting the semiconductor wafer in which many nonvolatile semiconductor memory devices 11 were formed, along with the dicing lines 52 and 53 with a dicing blade.

As explained above, in the nonvolatile semiconductor memory device 11 regarding to the 1st embodiment of this invention, the external memory cell arrays 22 and 24 were electrically separated from the internal memory cell arrays 21 and 23, and it has arranged on the outside of the active area 25.

For this reason, in case a semiconductor wafer is divided into chips 26, even if damage occurs in the external memory cell arrays 22 and 24, trouble is not exerted on operation of the internal memory cell arrays 21 and 23.

Consequently, the external memory cell arrays 22 and 24 can be arranged near the end of a chip as a dummy memory cell, without increasing chip size.

Therefore, small and a reliable nonvolatile semiconductor memory device can be obtained.

Next, the 2nd embodiment of this invention is explained in detail with reference to a drawing. The 2nd embodiment of this invention is related with the composition of the peripheral circuit 17 illustrated to FIG. 1 of the first embodiment. In addition, about this embodiment, the layout of a nonvolatile semiconductor memory device can apply what did not restrict to what was shown in FIG. 1, and was shown in FIG. 6. Moreover, it is not limited to these layouts.

Figure 6:
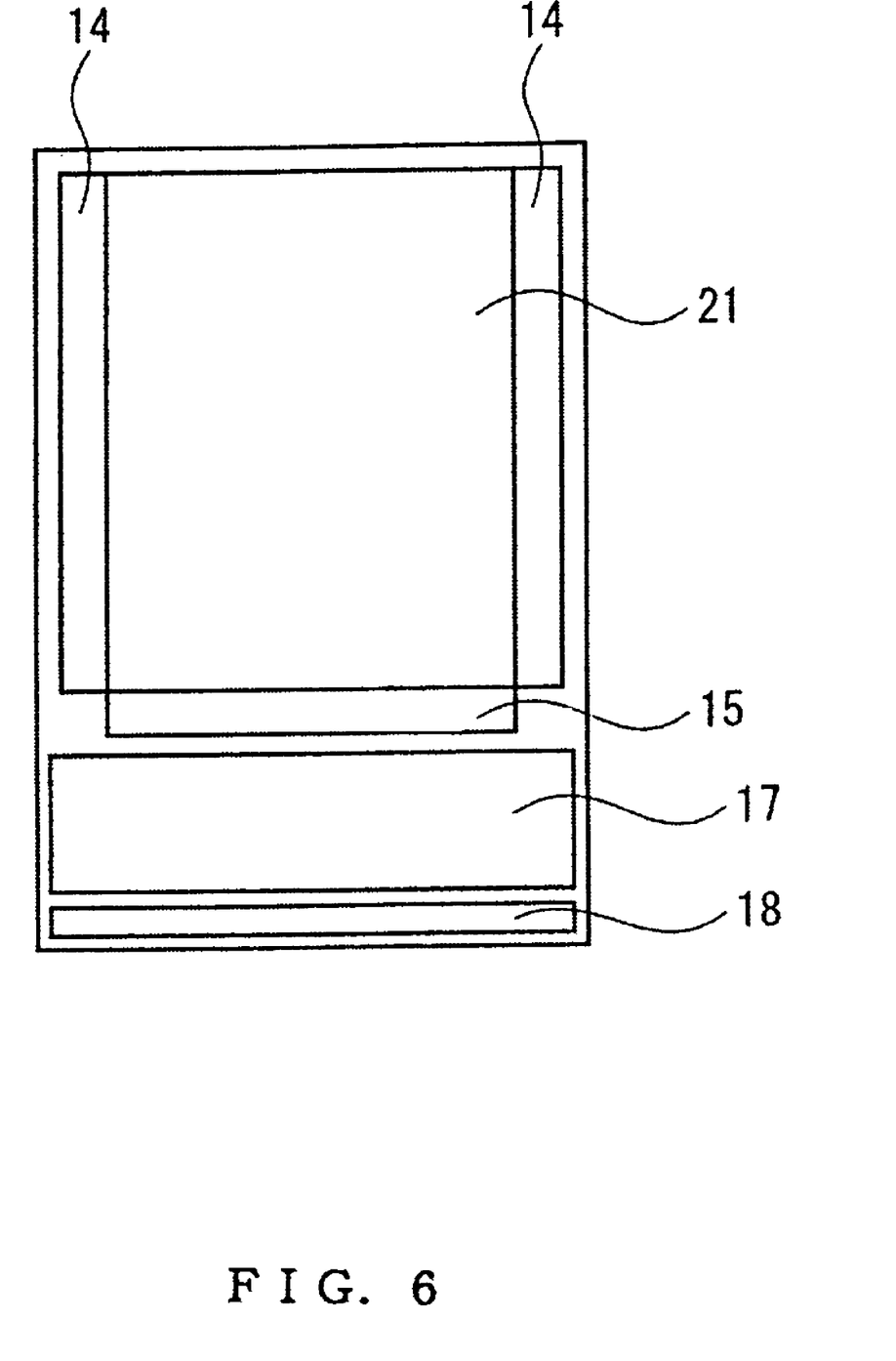
FIG. 6 is a figure showing the nonvolatile semiconductor memory concerning the second embodiment of this invention.

The layout shown in FIG. 6 is explained compared with the layout shown in FIG. 1. The same sign is given to the same portion as FIG. 1. Explanation is omitted about the same portion as FIG. 1. With the layout shown in FIG. 6, a memory cell array has only the internal memory cell array 21. There is no external memory cell array 22. The row decoder 4 is in the outside of an internal memory cell (memory cell 21 in a figure). Others do not change comparing to FIG. . .

Figure 7:
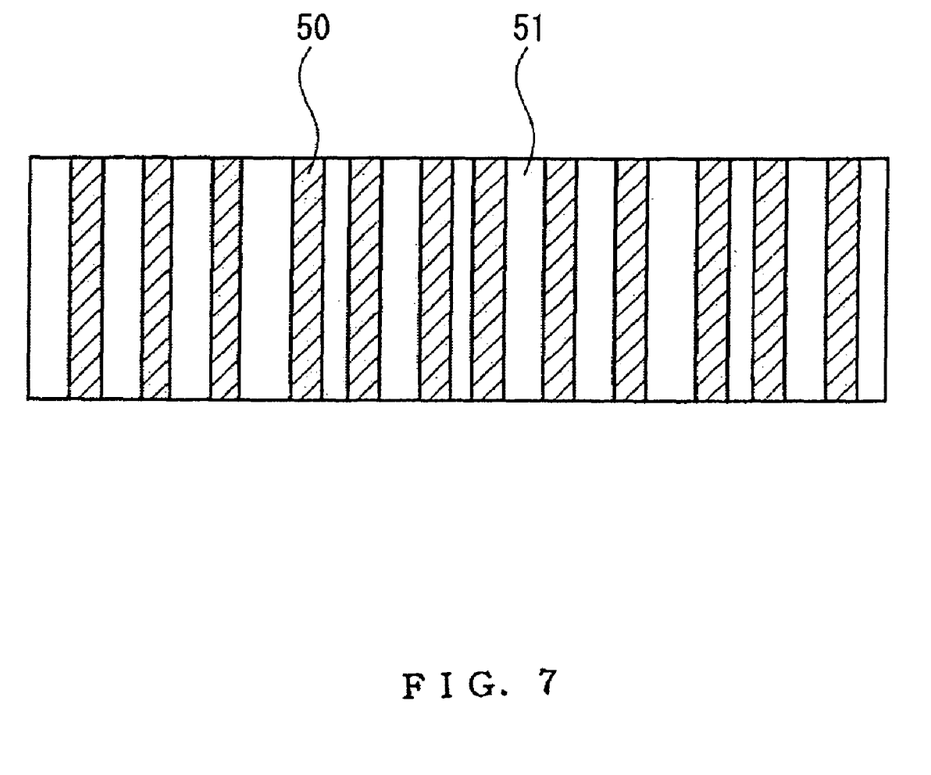
FIG. 7 is a figure showing the peripheral circuit of the nonvolatile semiconductor memory concerning the second embodiment of this invention.

The enlarged figure of the peripheral circuit part of this embodiment is typically shown in FIG. 7. The circuit area 50 and the wiring area 51 are arranged by turns. Here, the circuit area is constituted by various kinds of control circuits which control a memory cell, the power supply circuit, the booster circuit, etc. On the other hand, the wiring which connects each circuit of the circuit area is formed in the wiring area.

In other words, many transistors for circuits are formed on the silicon substrate of the circuit area. On the other hand, active elements, such as a transistor, formed in the wiring area on the silicon substrate, are few. Many upper wiring layers are formed there.

Figure 8:
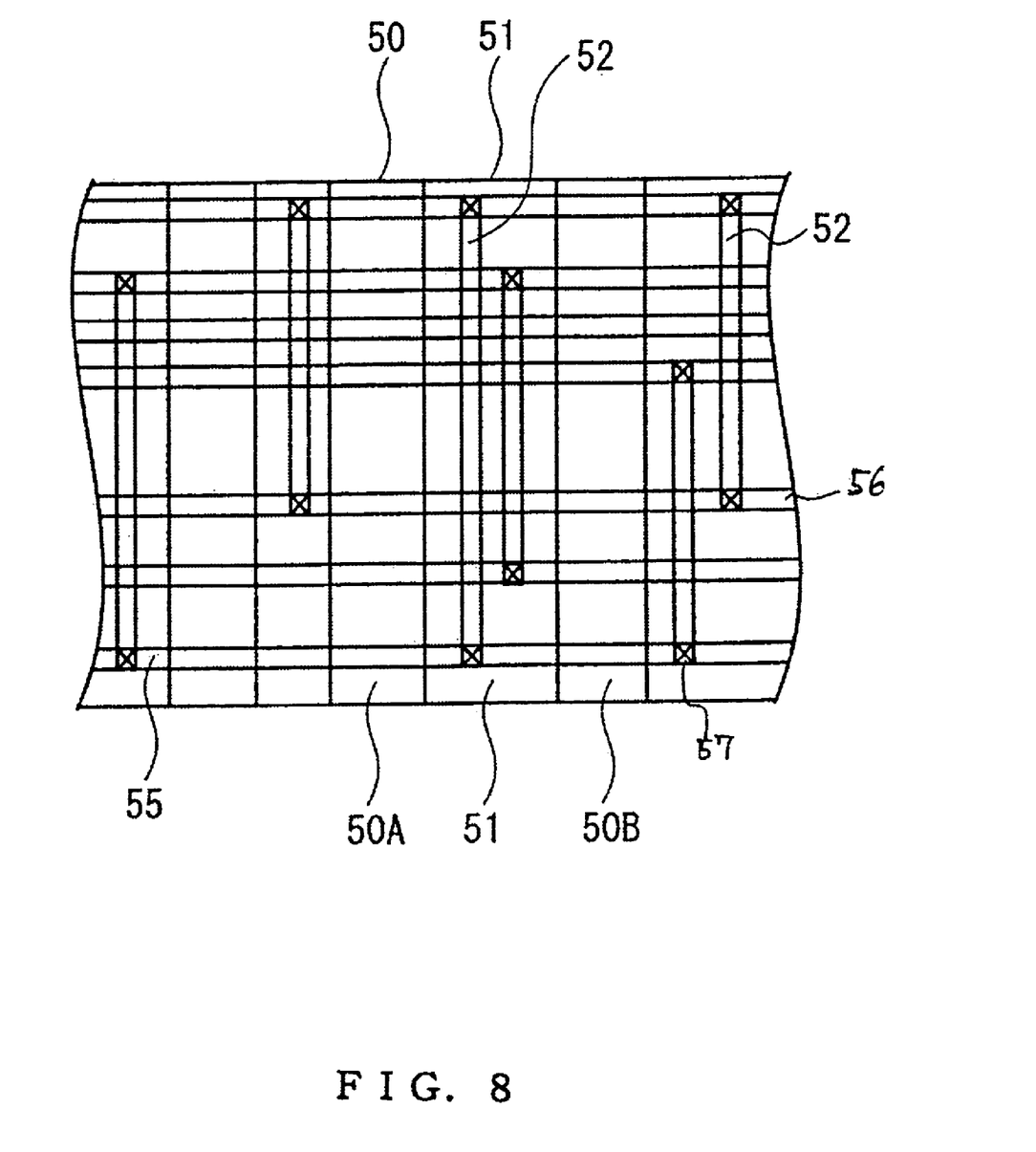
FIG. 8 is a figure showing a part of peripheral circuit of the nonvolatile semiconductor memory concerning the second embodiment of this invention.

A part of peripheral circuit area is extracted, and the wiring state of the wiring area is typically shown in FIG. 8. As shown here, wiring 52 is formed in the wiring area in parallel with lengthwise, i.e., the direction which goes to a pad arrangement part from the memory cell part of FIG. 6. These wiring is electrically connected with the transverse direction wiring 55 and 56 arranged at the transverse direction in a figure through the contact hole 57, mainly in the wiring area. The transverse direction wiring 55 and 56 etc. is formed in wiring layer other than that of wiring 52.

Next, the capacitor which arranged between power supplies is explained.

The voltage emitted from power supply nodes arranged at the peripheral circuit part, such as Vdd and Vss, is impressed to a circuit through wiring 56 and 57 grades. It is necessary to design wiring resistance low as much as possible. But in order to reduce the size of the semiconductor device itself, making wiring width thin can not be avoided and wiring resistance may become large.

Above described wiring resistance may cause a temporary supply voltage descent, when a big transient current flows. If there is these supply voltage descent, the incorrect operation of a circuit may occur and it is not desirable. Preparing a capacitor between power supplies is performed as a policy which prevents such a voltage drop.

Figure 9:
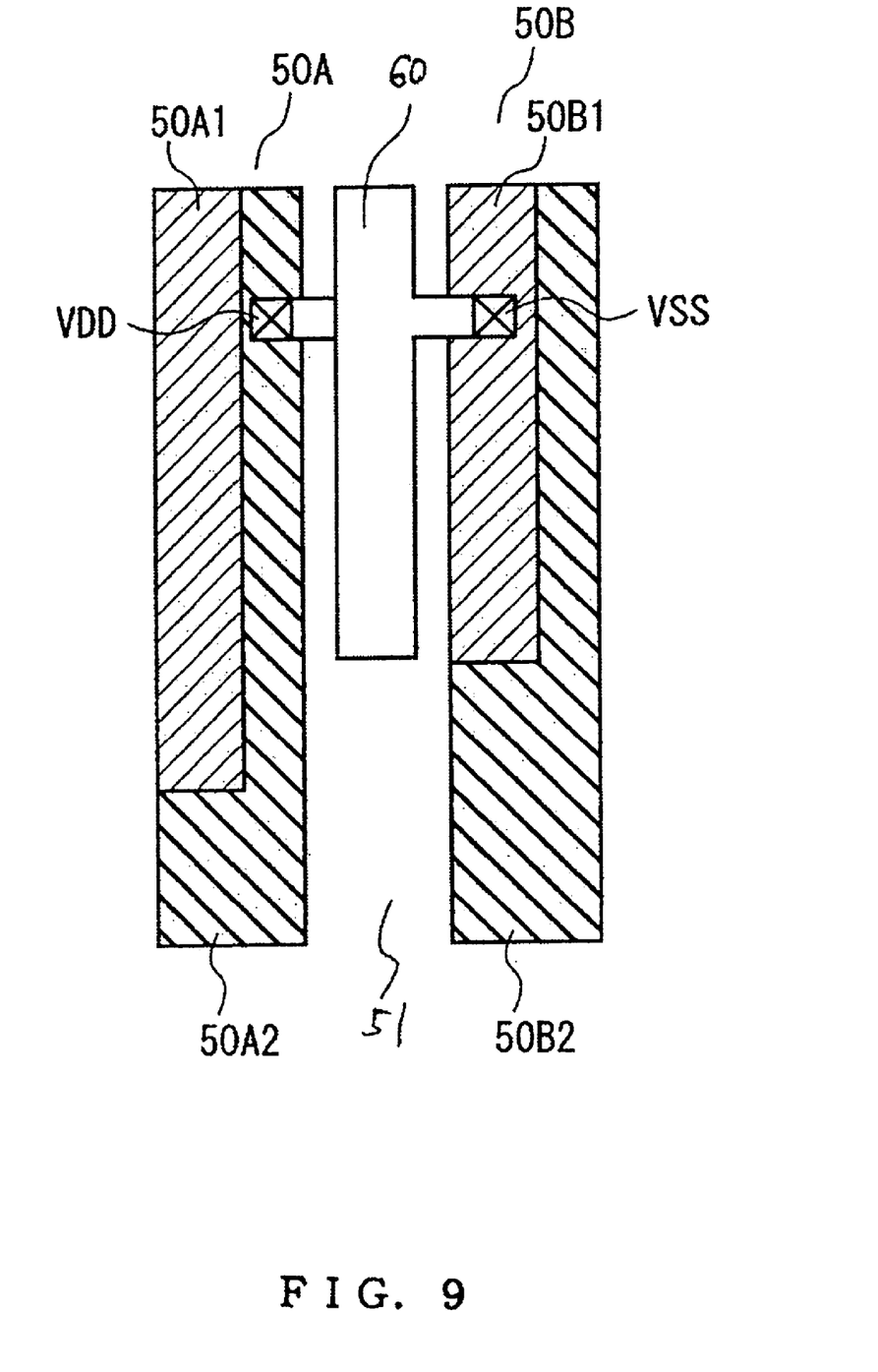
FIG. 9 is a figure which gives explanation regarding to capacitor in the peripheral circuit of the nonvolatile semiconductor memory concerning the second embodiment of this invention.

In this embodiment, as shown in FIG. 9, this capacitor 60 has been arranged in said wiring area 51. This capacitor is so-called MIM structure capacitor, which carried out the laminating of the poly silicon layer through the insulated film on the diffusion layer of a silicon substrate. However, when arranging such a capacitor to the circuit area, other transistors etc. cannot be formed in the area, but the area for capacitors is needed independently.

In this embodiment, a capacitor can be installed in the wiring area.

On the other hand, it is possible to form, in the upper part, the wiring electrically insulated with the capacitor. Therefore, it is not necessary to secure the arrangement area for capacitors newly. For example, the upper wiring 52 is formed on the wiring area 51 inserted into the circuits areas 50A and 50B of FIG. 8.

Next, the silicon-substrate area of the portion corresponding to 51 and 50A, 50B, are shown in FIG. 9. A Vdd 50A terminal and a Vss 50B terminal are arranged to the areas which counters mutually. The MIM type capacitor 60 is formed in the silicon surface on the wiring area 51.

The MIM type capacitor 60 is between Vdd and Vss terminal. The MIM type capacitor 60 is electrically connected to each terminal. On the other hand, it is not connected to the upper wiring 52. Thereby, the wiring 52 and the capacitor 51 between power supplies, which function independently, can be formed in the area on the same silicon-substrate area.

Next, the third embodiment of this invention, is explained using a drawing.

In addition, the same sign is given to the same portion as the first embodiment and the second embodiment, and explanation is omitted.

Figure 10:
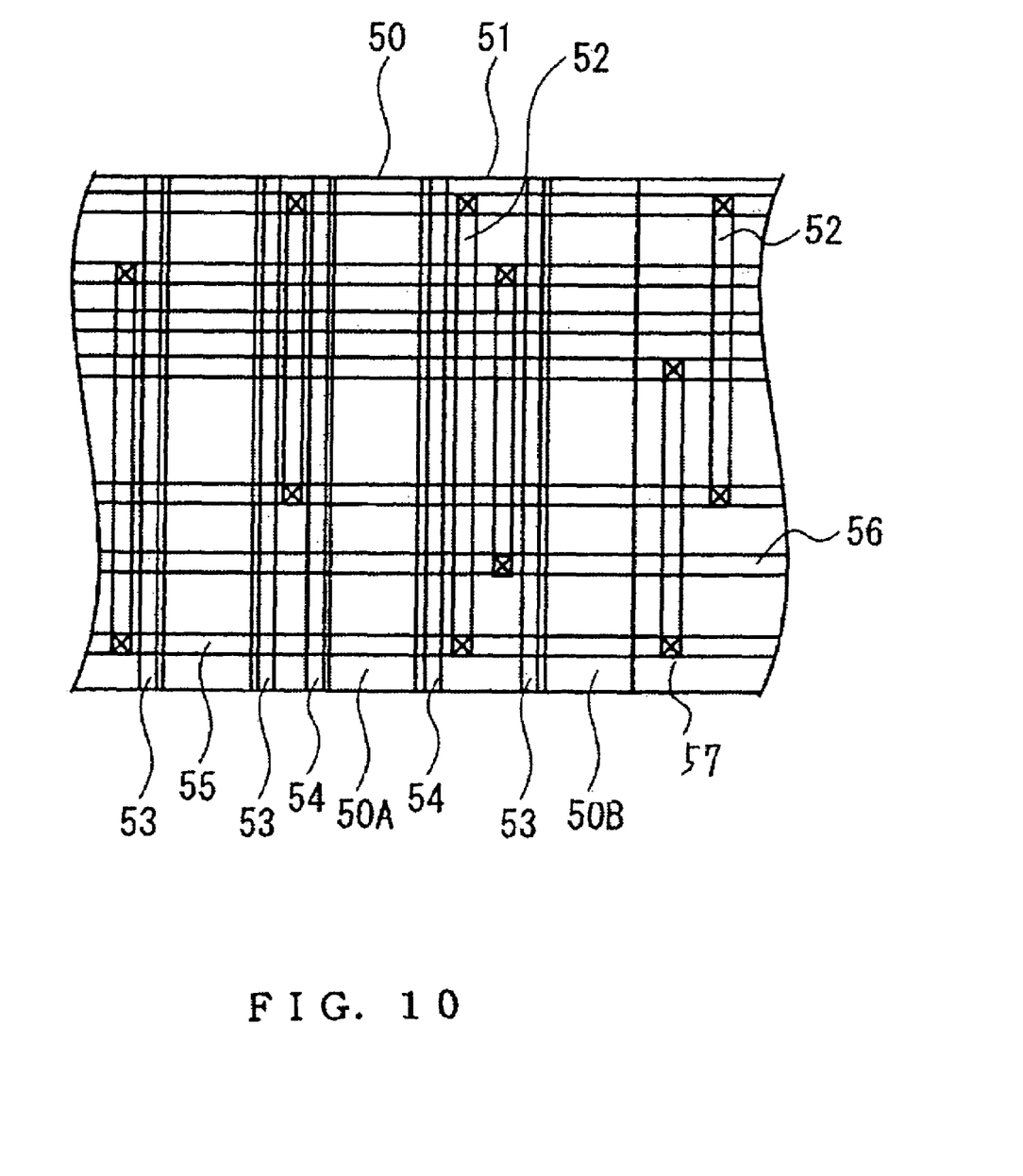
FIG. 10 is a figure showing a part of peripheral circuit of the nonvolatile semiconductor memory concerning the third embodiment of this invention.

FIG. 10 shows a part of peripheral circuit of the third embodiment like FIG. 8 of the second embodiment. Although it is almost the same as that of FIG. 8, along with the 50A side and the 50B side, the new wiring 54 and 53 is arranged to 51 areas between 50A and 50B, respectively.

Figure 11:
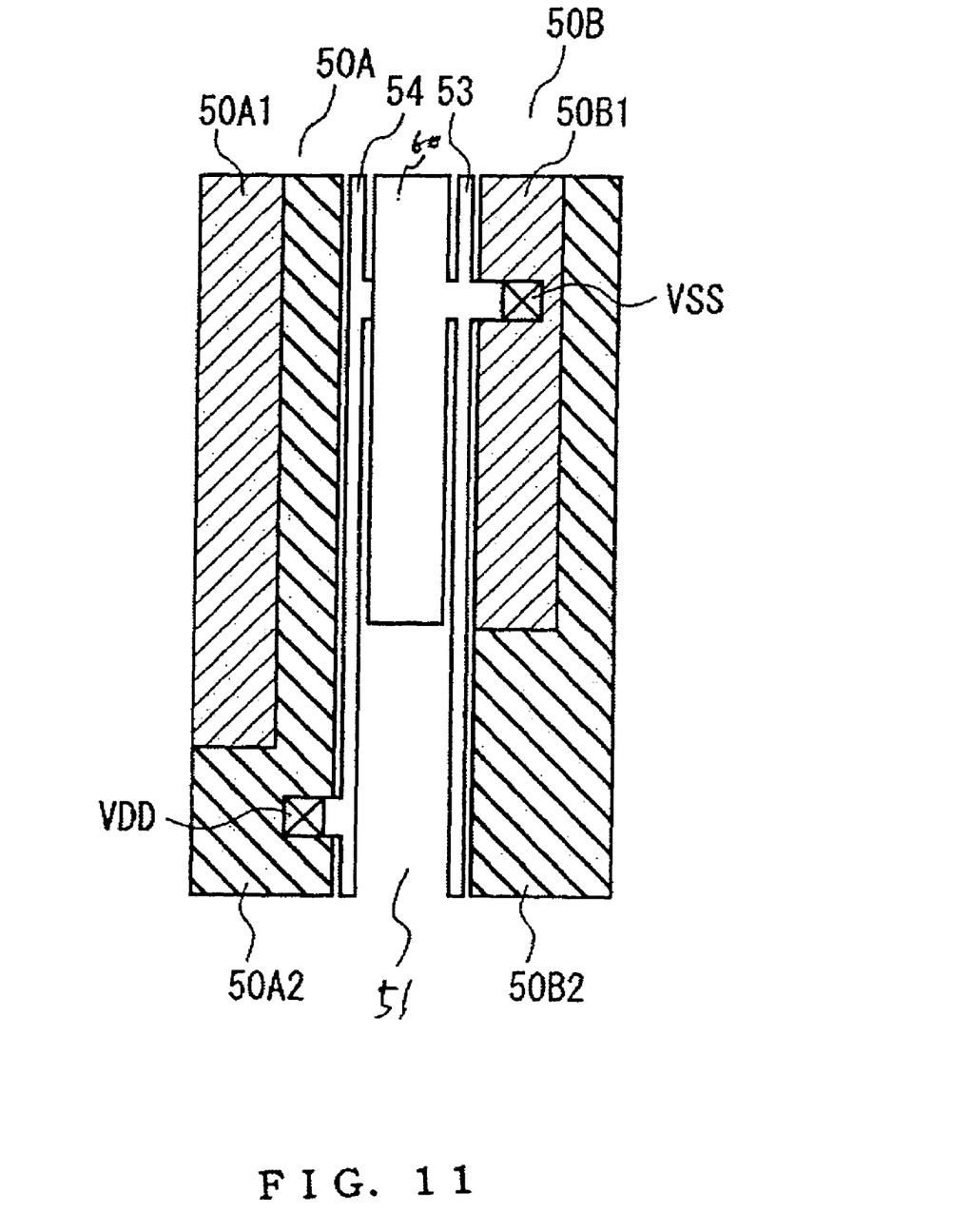
FIG. 11 is a figure which gives explanation regarding to capacitor in the peripheral circuit of the nonvolatile semiconductor memory concerning the third embodiment of this invention.

On the other hand, the outline of the silicon substrate surface part of FIG. 10 is shown in FIG. 11 like FIG. 9 of the second embodiment. Unlike FIG. 9, in FIG. 11, the Vdd node and the Vss node have not countered in position. Moreover, although the Vss node has countered with the capacitor 60 in 51, Vdd has not countered with a capacitor 60.

In such a case, in the above-mentioned second embodiment, a capacitor was not connectable between Vdd and Vss. In this third embodiment, a Vdd node is connected to the Vdd wiring 54, and it connects with a capacitor from the Vdd wiring 54. A Vss node is similarly connected to the Vss wiring 55, and it connects with a capacitor from the Vss wiring 55. In this embodiment, the Vdd wiring 54 and the Vss wiring 55 are continuously formed from the upper part to the lower part of a peripheral circuit part. For this reason, it is possible to connect a capacitor, even if the Vdd node and the Vss node have estranged. Moreover, it is possible to connect a capacitor, even if the capacitor has not countered with a Vdd node and a Vss node.

Figure 12:
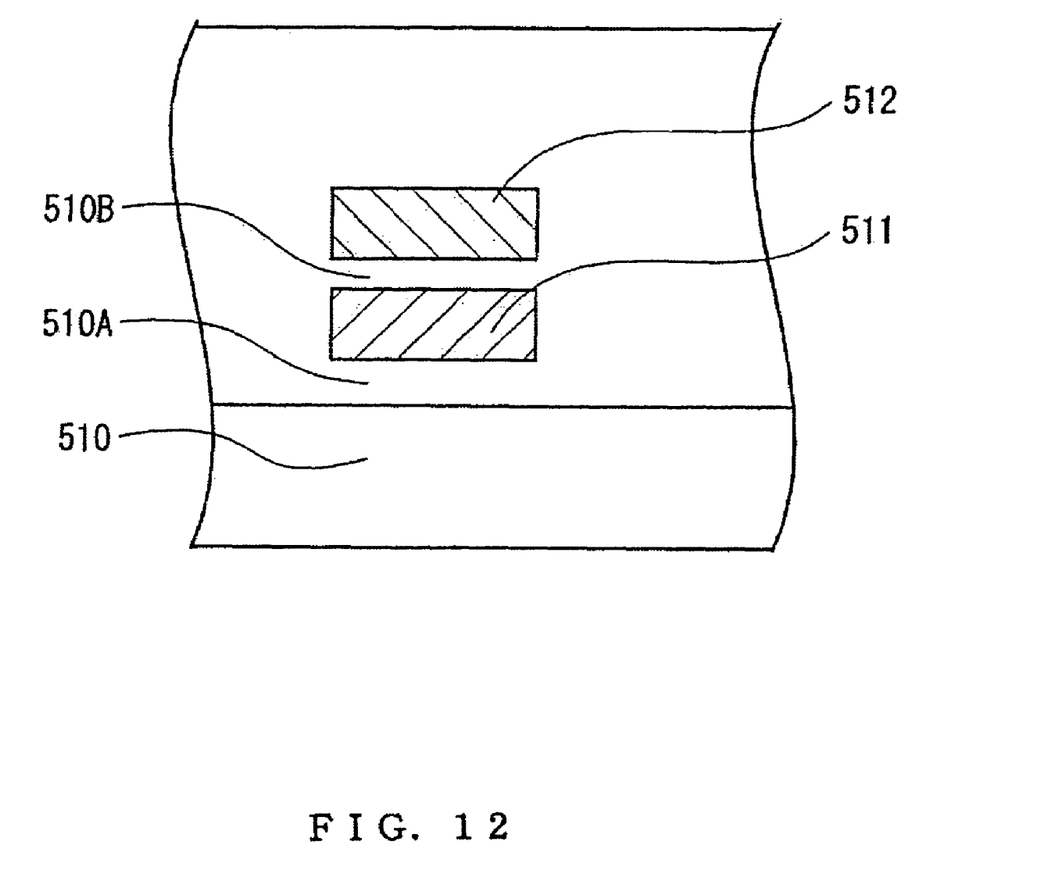
FIG. 12 is a cross-sectional schematic diagram of the capacitor of FIG. 11.

FIG. 12 is a cross-sectional schematic diagram of capacitor 60 portion of FIG. 11. The capacitor 60 of FIG. 11 comprising an upper electrode 512 connected to wiring 53, the lower electrodes 511 connected to wiring 54, and insulatung film 510B interposed therebetween. Here, upper electrode 512 is corresponding to the control gates 32 of FIG. 3, and lower electrode 511 is corresponding to the floating gate 42 of FIG. 3, respectively. That is, the control gates 32 of FIG. 3 and upper electrode 512, and, the floating gate 42 of FIG. 3 and lower electrode 511, respectively, are almost have the same thickness and are almost the same material. Therefore, this capacitor can be formed simultaneously with the memory cell array of FIG. 3, and a manufacturing process steps does not increase.

Moreover, the lower electrode 511 of FIG. 12 can be used as the layer connected to wiring 53, and the well 510 of FIG. 12 can be used as the layer connected to wiring 54 of the capacitor 60 of FIG. 11, respectively.

In, also in this case, well 510 corresponds to the bit lines 31 and lower electrode 511 of FIG. 3 correspond with the floating gate 42 of FIG. 3, respectively.

That is, the floating gate 42 of FIG. 3, and lower electrode 511 are almost the same thickness and almost the same material.

Therefore, this capacitor can be formed simultaneously with the memory cell array of FIG. 3, and a manufacturing process steps do not increase.

In each embodiment mentioned above, although the nonvolatile semiconductor memory device which has two memory cell arrays was explained, this invention is not limited to this and may be applied to the nonvolatile semiconductor memory device which has further many memory cell arrays.

Moreover, this invention can be applied to other semiconductor memory devices which have a dummy memory cell array, for example, DRAM, (Dynamic Random Access Memory).

What is claimed is:

1. A nonvolatile semiconductor memory device comprising:
    a memory cell array formed on one side of a rectangular shaped semiconductor substrate;
    a row decoder and a column decoder to select a memory cell of the memory cell array;
    a peripheral circuit to write and read the selected memory cell; and
    conductive pads arranged along with the opposite side of the rectangular shaped semiconductor substrate, wherein
    the peripheral circuit comprising,
    a capacitor connected to a bias terminal via a capacitor wiring, and
    wiring areas and element areas, both said wiring areas and element areas arranged alternatively along with the direction from the memory cell array to the pads.

2. The nonvolatile semiconductor memory device according to claim 1, wherein
    the capacitor is arranged in the wiring area.

3. The nonvolatile semiconductor memory device according to claim 1, wherein the capacitor is the MIM capacitor.

4. A nonvolatile semiconductor memory device comprising:
   a memory cell array formed on one side of a rectangular shaped semiconductor substrate;
   a row decoder and a column decoder to select a memory cell of the memory cell array;
   a peripheral circuit to write and read the selected memory cell, the peripheral circuit comprising a MIM capacitor connected to a bias terminal via a capacitor wiring;
   conductive pads arranged along with the opposite side of the rectangular shaped semiconductor substrate; and
   a memory cell of the memory cell array comprising a charge accumulation layer, a word line on the charge accumulation layer and an insulating film therebetween, the thickness of an electrode of the MIM capacitor is the same as the thickness of the charge accumulation layer.

5. The nonvolatile semiconductor memory device according to claim 4, wherein
   the memory cell array comprises a cell string including a plurality of nonvolatile memory cells connected in series.

6. The nonvolatile semiconductor memory device according to claim 1, wherein the capacitor is the MIM capacitor.

7. The nonvolatile semiconductor memory device according to claim 6, wherein
   the capacitor connected to the bias terminal via a wiring in the wiring area.

8. The nonvolatile semiconductor memory device according to claim 7, wherein
   the capacitor is arranged between the two different bias terminals in the peripheral area and connected to the bias terminals via a wiring respectively.

9. The nonvolatile semiconductor memory device according to claim 8, wherein a memory cell of the memory cell array comprises a charge accumulation layer, a word line and an insulating film therebetween, a thickness of an electrode of the MIM capacitor is the same as the thickness of the charge accumulation layer.

10. The nonvolatile semiconductor memory device according to claim 4, wherein
    the memory cell array comprises a cell string including a plurality of nonvolatile memory cells connected in series.

* * * * *